(12) United States Patent
Ahrens et al.

(10) Patent No.: US 8,753,982 B2
(45) Date of Patent: Jun. 17, 2014

(54) METHOD FOR PRODUCING A CONNECTION REGION ON A SIDE WALL OF A SEMICONDUCTOR BODY

(75) Inventors: Carsten Ahrens, Pettendorf (DE);
Berthold Schuderer, Regensburg (DE);
Stefan Willkofer, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/468,748

(22) Filed: May 10, 2012

(65) Prior Publication Data

US 2012/0289047 A1    Nov. 15, 2012

(51) Int. Cl.
*H01L 21/44* (2006.01)

(52) U.S. Cl.
USPC ........... 438/675; 438/106; 438/343; 257/140; 257/506

(58) Field of Classification Search
USPC ......... 438/675, 106, 243–244, 343, 286, 387; 257/140, 301, 305, 68, 506, 684, 779, 257/762
See application file for complete search history.

(56) References Cited

U.S. PATENT DOCUMENTS

| | | | |
|---|---|---|---|
| 5,606,198 A * | 2/1997 | Ono et al. | 257/666 |
| 5,682,062 A | 10/1997 | Gaul | |
| 6,225,207 B1 * | 5/2001 | Parikh | 438/622 |
| 6,300,224 B1 * | 10/2001 | Arima et al. | 438/462 |
| 6,611,050 B1 * | 8/2003 | Ference et al. | 257/679 |
| 7,375,434 B2 * | 5/2008 | Gross | 257/779 |
| 7,378,741 B2 | 5/2008 | Mauder | |
| 7,407,852 B2 * | 8/2008 | Su et al. | 438/243 |
| 7,591,071 B2 * | 9/2009 | Ibe et al. | 29/890.1 |
| 7,663,222 B2 | 2/2010 | Lohninger et al. | |
| 7,665,201 B2 * | 2/2010 | Sjoedin | 29/592.1 |
| 8,158,520 B2 * | 4/2012 | Ning | 438/687 |
| 2005/0029668 A1 * | 2/2005 | Poo et al. | 257/773 |
| 2006/0073979 A1 * | 4/2006 | Thieme et al. | 505/434 |
| 2006/0076689 A1 * | 4/2006 | Rhodes | 257/774 |
| 2006/0228880 A1 * | 10/2006 | McDaniel et al. | 438/625 |
| 2007/0015327 A1 * | 1/2007 | Su | 438/244 |
| 2007/0148792 A1 * | 6/2007 | Marx et al. | 438/14 |
| 2009/0188553 A1 * | 7/2009 | Dubin | 136/256 |
| 2009/0250749 A1 * | 10/2009 | Park | 257/330 |

FOREIGN PATENT DOCUMENTS

DE    103 51 028 A1    6/2005
DE    10 2005 004 160 A1    8/2006

* cited by examiner

*Primary Examiner* — Phuc Dang
(74) *Attorney, Agent, or Firm* — Slater & Matsil, L.L.P.

(57) ABSTRACT

A method for producing a connection region on a side wall of a semiconductor body is disclosed. A first trench is produced on a first surface of a semiconductor body and extends into the semiconductor body. An insulation layer is formed on the side walls and on the bottom of the first trench, and the first trench is only partially filled. The unfilled part of the first trench is filled with an electrically conductive material. A separating trench is produced along the first trench in such a way that a side wall of the separating trench directly adjoins the first trench. The part of the insulation layer which adjoins the separating trench is at least partially removed, with the result that at least some of the electrically conductive material in the first trench is exposed.

18 Claims, 17 Drawing Sheets

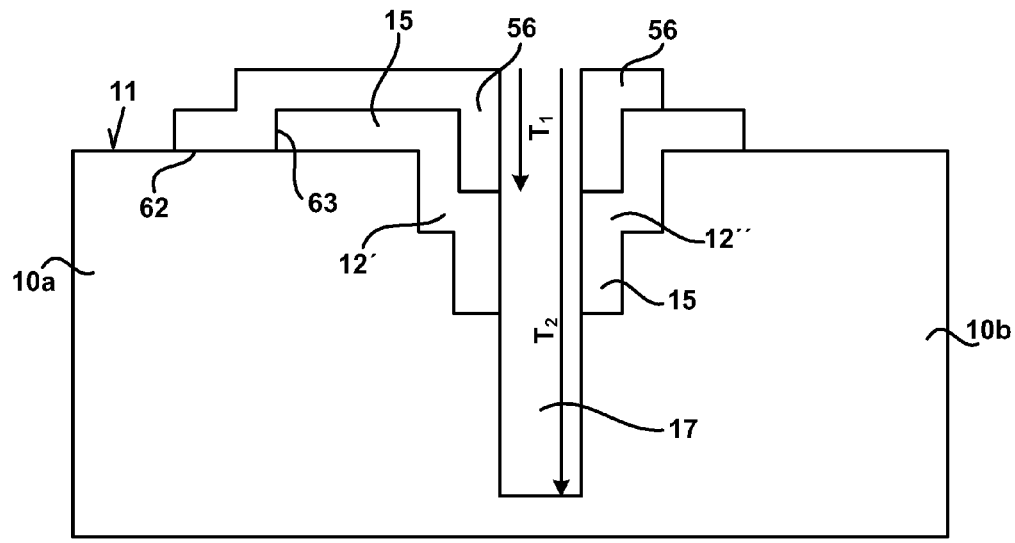
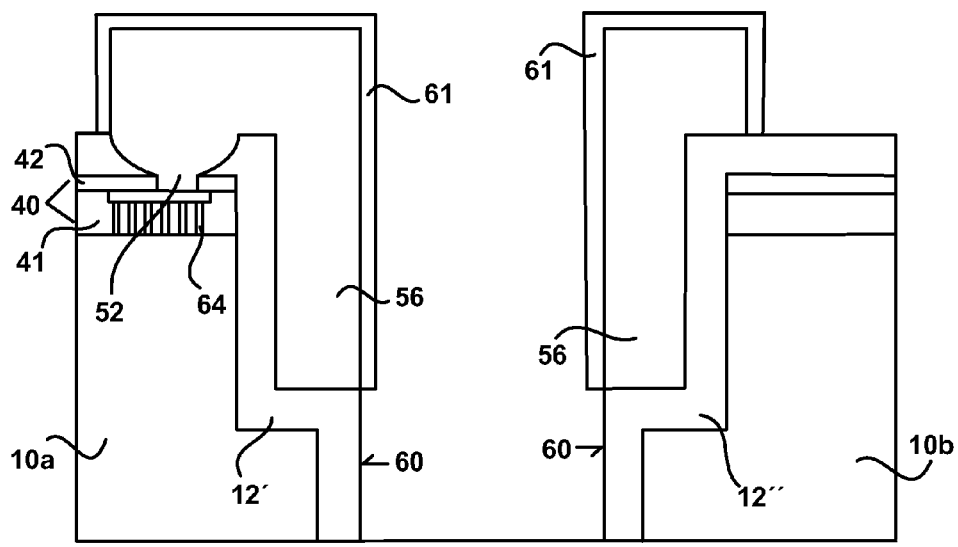

METHOD FOR PRODUCING A CONNECTION REGION ON A SIDE WALL OF A SEMICONDUCTOR BODY

This application claims priority to German Patent Application 10 2011 101 035.5 which was filed May 10, 2011, and is incorporated herein by reference.

TECHNICAL FIELD

Exemplary embodiments of the invention relate to a method for producing a connection region on a side wall of a semiconductor body and to a method for producing a semiconductor module having a connection region on a side wall.

BACKGROUND

Semiconductor modules having connection regions on a side wall are necessary, for example, for CSP (chip size package) module housings in which a connection region is formed on a side wall of a semiconductor body in a particularly space-saving design, wherein this connection region is insulated from the semiconductor body by a side wall insulation layer. Such a design is described, for example, in DE 10 2005 004 160 A1.

SUMMARY OF THE INVENTION

In one aspect, the invention provides a method for producing a connection region on a side wall of a semiconductor body and a method for producing a semiconductor module having a side wall connection region.

One embodiment of the method for producing a connection region on a side wall of a semiconductor body. At least a first trench is formed at a first surface of the semiconductor body and extends into the semiconductor body. And electrical insulation layer is formed on the side walls and on the bottom of the first trench such that the first trench is only partially filled. The still unfilled part of the first trench is filled with an electrically conductive material. A separating trench is formed along the first trench in such a way that a side wall of the separating trench directly adjoins the first trench. The part of the insulation layer that adjoins the separating trench is at least partially removed, with the result that at least some of the electrically conductive material in the first trench is exposed.

The method provides, for example, advantages in that it permits the electrical insulation layer to be formed in a defined fashion in the first trench. The connection region can already be produced on the side wall of the semiconductor body before the semiconductor modules are individuated. The production of the connection region with defined dimensions does not require any complex lithography for performing structuring on the side wall of the semiconductor body. The contamination risk with the electrically conductive material of the connection region in the process chambers, for example during the production of the separating trenches, is virtually eliminated by virtue of the structure of the electrically conductive material being embedded in the electrical insulation layer.

It is a development if the first trench is generated with a depth T1, and the separating trench is generated with a depth T2 extending into the semiconductor body, wherein T2≥T1. As a result, for example, the connection region can be formed over as large an area as possible and the later individuation of the semiconductor body to form semiconductor modules is easier.

One embodiment of the method provides that the first trench is produced in two parts, wherein a first trench part is narrower than the second trench part. As a result, it is possible, for example, for the side wall of the semiconductor body to be provided with the insulation layer over a large area. In particular, if the first trench part is produced extending deeper into the semiconductor body than the second trench part, advantageous side wall insulation of the semiconductor body can be produced.

An exemplary embodiment for producing a two-part first trench is also disclosed. A mask layer is formed on the first surface of the semiconductor body. A mask opening with a first width is formed in the mask layer. The semiconductor body is etched under the mask opening. The first mask opening is wide and to form a mask opening with a second width. The semiconductor body under the widened mask opening is attached such that the first and second trench parts are produced.

In particular, if the first trench part is filled completely by the electrical insulation layer and/or the side wall, oriented toward the separating trench, of the first trench part and the side wall, oriented toward the separating trench, of the second trench part form a planar side wall of the first trench, the side wall insulation of the semiconductor body, which is mentioned by way of example, can be produced particularly easily and reliably.

It is a further development of the method if at least two first trenches are produced in the semiconductor body, wherein the separating trench is produced between two of these first trenches. This measure makes it possible to produce, for example, a plurality of semiconductor modules with a connection region on the side wall in a particularly easy way. In particular, this also applies to the embodiment in which a first trench adjoins each of two opposite side walls of the separating trench.

In a further embodiment of the method there is provision that the electrical insulation layer is formed at least on the side wall, facing away from the separating trench, of the first trench, and on the bottom of the first trench with a thickness D of at least 2 μm. This may serve, for example, to minimize parasitic capacitances. This applies, in particular, if the thickness D of the electrical insulation layer is greater than 10 μm.

One further development of the invention provides that the exposed electrically conductive material is coated with an electrically conductive protective layer. This measure makes it possible to protect, for example, the electrically conductive material against environmental influences.

One exemplary embodiment provides that the exposed electrically conductive material and/or, if present, the electrically conductive protective layer is suitable for being wetted by a solder. This may be advantageous, for example, for the formation of contact with the connection region.

It is a further embodiment of the method if the electrically conductive material forms an electrically conductive layer which extends from the first trench to at least one contact region for the semiconductor body, wherein the contact region is located on the first surface of the semiconductor body, at a lateral distance from the first trench. This makes it possible, for example, for contact to be made with active semiconductor regions in the semiconductor body via the connection region on the side wall.

One embodiment provides that an electrically conductive contact element is formed between the electrically conductive material and the semiconductor body in the contact region, with the result that an electrical connection is produced between the semiconductor body and the electrically conductive material.

It is a further development of the method if the semiconductor body is provided with a further electrical insulation layer in the semiconductor body, wherein the further electrical insulation layer is formed parallel to the first surface of the semiconductor body. In particular, if the at least one first trench is produced extending as far as the further electrical insulation layer in the semiconductor body, the later semiconductor module may comprise, for example, a semiconductor body having an electrical insulation layer which is formed in a coherent fashion both on the bottom and on the side walls.

It is an exemplary embodiment of a method for producing a semiconductor module having a connection region on a side wall of the semiconductor module if the connection region is produced on the side wall of the semiconductor module according to a method as claimed in the previously specified exemplary embodiments, wherein the separating trench is produced extending from a surface of the semiconductor body as far as an opposite surface of the semiconductor body. This may be used for directly individuating the semiconductor body to form semiconductor modules. Alternatively, the separating trench can be produced extending from the first surface of the semiconductor body into the semiconductor body, and at least part of the semiconductor body on a second surface, which is located opposite the first surface, can be removed as far as the separating trench. To do this, for example a trench can be produced on the second surface of the semiconductor body, extending as far as the separating trench. However, the semiconductor body can also be thinned over the entire second surface until the second surface of the semiconductor body reaches the separating trench.

BRIEF DESCRIPTION OF THE DRAWINGS

For a more complete understanding of the present invention, and the advantages thereof, reference is now made to the following descriptions taken in conjunction with the accompanying drawing, in which:

FIG. 5 shows, in a schematic cross-sectional view, an intermediate result of a further exemplary embodiment of the method for producing a connection region on a side wall of a semiconductor body;

FIG. 6 shows, in a schematic cross-sectional view, a further development of the method for producing a connection region on a side wall of a semiconductor body;

DETAILED DESCRIPTION OF ILLUSTRATIVE EMBODIMENTS

Exemplary embodiments of the invention are explained in more detail below with reference to the appended figures. However, the invention is not restricted to the specifically described embodiments but rather can be modified and refined in a suitable way. The scope of the invention includes combining individual features and feature combinations of one embodiment with feature and feature combinations of another embodiment in a suitable manner in order to arrive at further inventive embodiments.

Before the exemplary embodiments of the present invention are explained in more detail below with reference to the figures, it is to be noted that identical elements in the figures are provided with the same or similar reference symbols, and that a repeated description of these elements will not be given. In addition, the figures are not necessarily to scale, the emphasis is rather on the explanation of the basic principle.

Figure 1A:
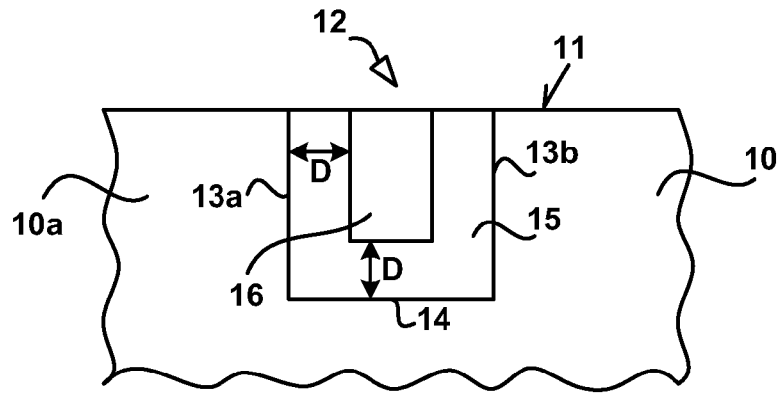
FIG. 1a to FIG. 1c show, in schematic cross-sectional views, intermediate results of a method for producing a connection region on a side wall of a semiconductor body.

FIG. 1a illustrates a semiconductor body 10 which is provided as the starting material for the rest of the method. The semiconductor body 10 may be produced, for example, from monocrystalline silicon, silicon carbide, gallium nitride, gallium arsenide or some other semiconductive material. The semiconductor body is generally embodied in the form of a plate with a first surface 11 and a second surface which is located opposite the first surface 11. The semiconductor body 10 may be a wafer in its original form. In further production steps this wafer can later also be cut up into small semiconductor modules (chips).

In the semiconductor body 10, at least a first trench 12 is produced on the first surface 11, extending into the semiconductor body 10. The first trench 12 may be produced extending into the semiconductor body 10 here using, for example, an etching process, in particular using a dry chemical etching process. The at least one first trench 12 may be produced in a first semiconductor body region 10a for a first semiconductor module.

An electrical insulation layer 15, which only partially fills the first trench 12, is formed at least on the side walls 13a and 13b and on the bottom 14 of the first trench 12. This electrical insulation layer 15 may be, for example, deposited or produced thermally. The electrical insulation layer 15 may be produced in a defined fashion with a thickness D correspondingly both on the side walls 13a and 13b and on the floor 14 with a deposition method, for example an SA-BPSG (Sub-Atmospheric Boron Phosphorus Silicate Glass) deposition. It is also possible to perform thermal oxidation of the semiconductor body 10 in order to form, for example, $SiO_2$ as an insulation layer 15. The thickness D of the electrical insulation layer 15 can be selected in such a way that parasitic capacitances are minimized. It is therefore recommended to have electrical insulation layers with thicknesses D which are larger than 2 μm, in particular D larger than 10 μm. For this purpose, when forming the first trench 12, it is necessary to ensure that there is a sufficient width B>2D and a sufficient depth T>D of the first trench 12.

Subsequently, the remaining, still unfilled part of the first trench 12 is filled with an electrically conductive material 16. For example a metal, which is, for example, deposited galvanically, can be used as the electrically conductive material 16. For the formation of contact later it may be advantageous if the electrically conductive material 16 can be wetted by a solder. In particular, copper is a suitable electrically conductive material 16 which can be used as the connection face of the finished semiconductor module.

Figure 1B:
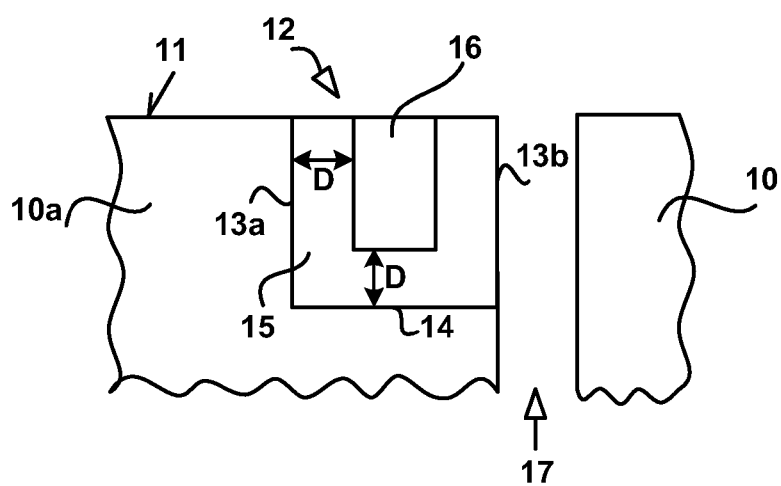

FIG. 1b illustrates a separating trench 17 produced extending along the first trench 12 and into the semiconductor body 10. The separating trench 17 is produced here in such a way that the side wall 13b of the first trench 12 directly adjoins the separating trench 17. This is done, for example, by selective etching of the semiconductor material of the semiconductor body 10, during which etching the electrical insulation layer 15 remains as a result of the selectivity of the etching. As a result, the part of the electrical insulation layer 15 which adjoins the separating trench 17 is exposed. A dry chemical etching process can be used, for example, as the etching method.

Figure 1C:
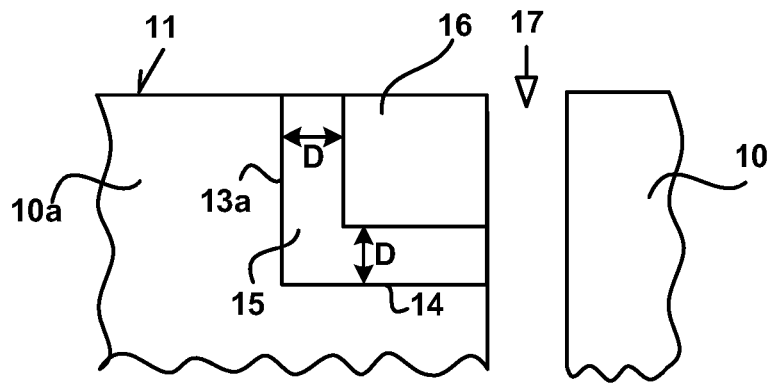

FIG. 1c illustrates an embodiment after the electrical insulation layer 15 which is exposed at the separating trench 17 has been removed at least to such an extent that the electrically conductive material 16 at the separating trench 17 is at least partially exposed. The removal of the electrical insulation layer 15 can also be carried out selectively with respect to the semiconductor material of the semiconductor body 10 and selectively with respect to the electrically conductive material 16 by, for example, wet chemical etching. The now exposed, electrically conductive material can optionally be coated with an electrically conductive protective layer to protect it against corrosion or other environmental influences. For example, this protective layer can be composed of NiP—AuPd which can be applied, for example in an electroless fashion, to copper. The protective layer should preferably also be capable of being wetted by a solder in order to facilitate the formation of contact later.

Figure 2A:
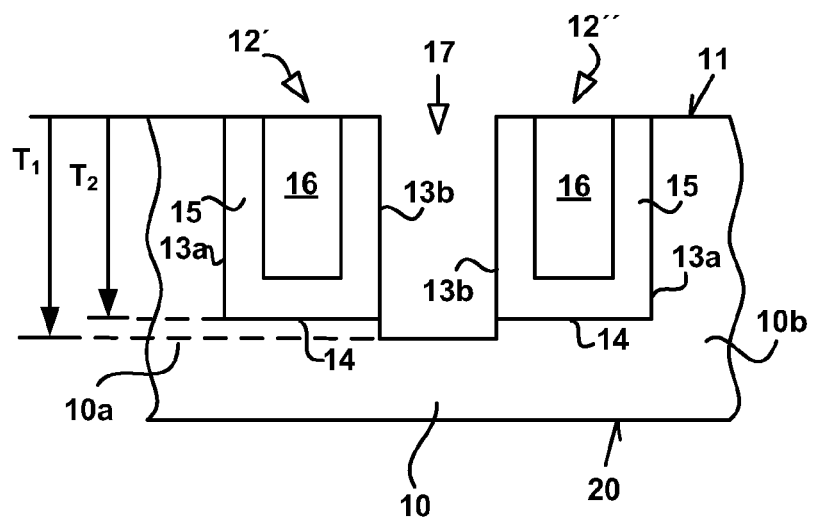
FIG. 2a to FIG. 2c show, in schematic cross-sectional views, intermediate results of a further development of the method for producing a connection region on a side wall of a semiconductor body and of a semiconductor module.

FIG. 2a illustrates a further development of the method in which, instead of a first trench 12, at least two first trenches 12' and 12" are produced in the semiconductor body 10. In this context, a first trench 12' is produced in a first semiconductor body region 10a for a first semiconductor body module, and another first trench 12" is produced in a second semiconductor body region 10b for a second semiconductor module, each extending with a depth T1 into the semiconductor body 10. The separating trench 17 is produced between two of these first trenches 12 with a depth T2 such that the separating trench 17 adjoins both first trenches 12. As a result, on one side of the separating trench 17 part of the electrical insulation layer 15 on the side wall 13b of the one first trench 12' is exposed, and on the opposite side of the separating trench 17 part of the electrical insulation layer 15 on the side wall 13b of the other first trench 12" is exposed. In the present case, the separating trench 17 is made deeper than the first trenches 12' and 12". However, said separating trench 17 can also be produced to have a smaller depth than a first trench 12 or the same depth as the first trench 12.

Figure 2B:
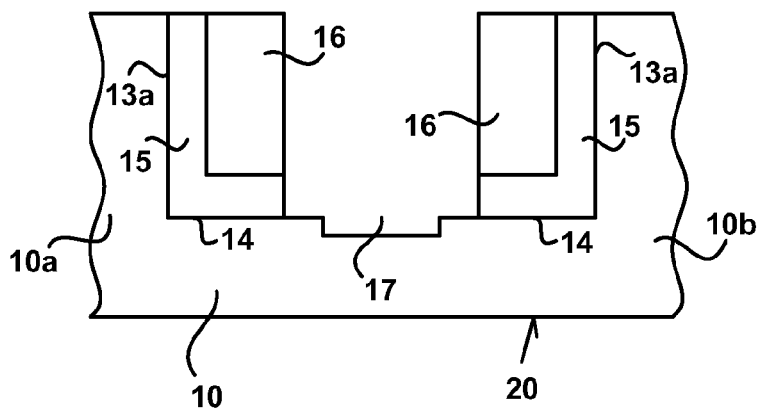
Figure 2C:
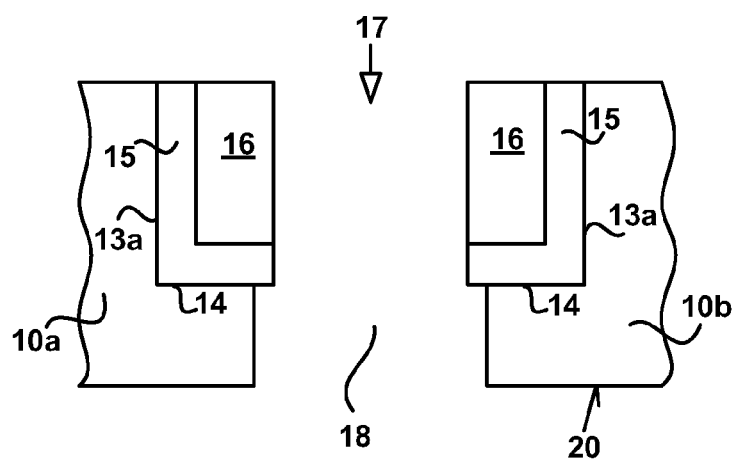

After, as illustrated in FIG. 2b, the parts of the electrical insulation layer 15 which are respectively oriented with respect to the separating trench 17 have been removed selectively with respect to the semiconductor body 10 and the electrically conductive material 16, a further trench 18 is produced on the second surface 20 of the semiconductor body, extending at least as far as the separating trench 17, but at most as far as the bottom 14 of a first trench 12. As a result, for example the semiconductor body 10 is divided between the semiconductor body region 10a and the semiconductor body region 10b, and two semiconductor modules are produced from the two semiconductor body regions 10a and 10b.

Figure 3A:
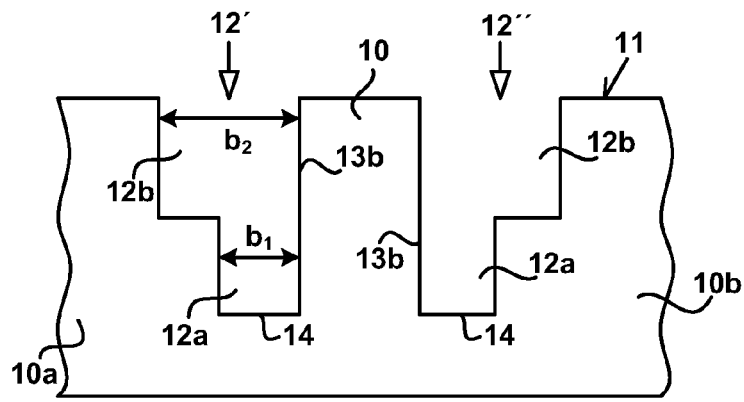
FIG. 3a to FIG. 3c show, in schematic cross-sectional views, intermediate results of a development of the method for producing a connection region on a side wall of a semiconductor body and of a semiconductor module.

FIG. 3a illustrates a further development of the method in which the first trench 12 has been produced in two parts. A first trench part 12a with a width b1 is made narrower here than the second trench part 12b with the width b2. In the illustrated embodiment, the first trench part 12a is also produced extending deeper into the semiconductor body 10 than the second trench part 12b. In the exemplary embodiment, the side wall 13b of each of the two illustrated first trenches 12' and 12", which are located opposite one another and are separated from one another by part of the semiconductor body 10, is formed without a step. This structure is produced if, for example, the part of the side wall 13b which is formed by the first trench part 12a and the part of the side wall 13b which is formed by the second trench part 12b merge with one another without an offset.

A first trench 12 which is divided into two may be produced, for example, as follows: at first, a mask layer is produced on the first surface 11 of the semiconductor body 10. Then, at least a first mask opening with a first width b1 is produced in the mask layer. The semiconductor body 10 is subsequently etched under this first mask opening, as a result of which a trench with a first width b1 comes about in the semiconductor body 10. After this, the first mask opening is widened to form a second mask opening with a second width b2. The semiconductor body 10 is then etched again under the widened second mask opening, as a result of which the trench which is firstly produced under the first mask opening is etched further and the newly added further trench with a width b2>b1 in the semiconductor body 10 forms the first and second trench parts 12a and 12b.

Figure 3B:
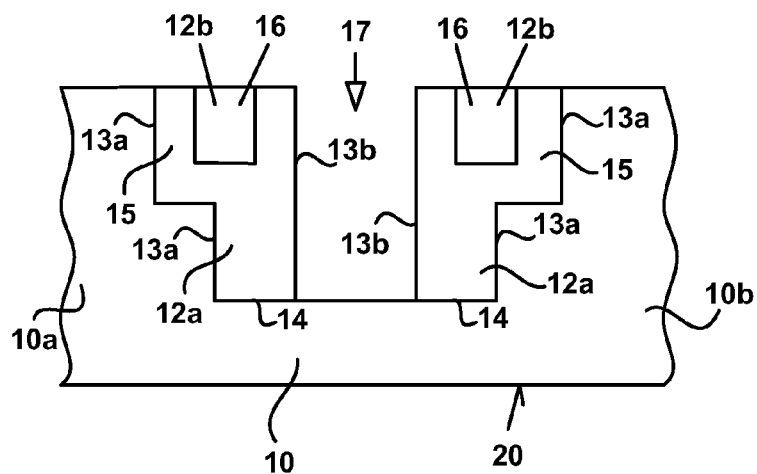

As illustrated in FIG. 3b, the first trenches 12' and 12" are each lined with an electrical insulation layer 15 on the side walls 13a and 13b and on the bottom 14. The first trench part 12a is completely filled by the electrical insulation layer 15 here, while initially a part remains open in the second trench part 12b. The complete filling of the first trench part 12a can be achieved, for example, by virtue of the fact that twice the thickness D of the deposited electrical insulation layer 15 is larger than the width b1 of the first trench part 12a: 2D>b1. The non-filled part in the second trench part 12b is subsequently filled with the electrically conductive material 16. Furthermore, FIG. 3b shows that the two first trenches 12' and 12" are produced in different semiconductor body regions 10a and 10b. The separating trench 17 is produced in the semiconductor body region located between the two first trenches 12' and 12" and between the semiconductor body regions 10a and 10b. The separating trench can be produced, for example by the selective etching of the semiconductor material with respect to the electrical insulation layer 15, with such a width that a first trench 12 adjoins each of the two opposite side walls of the separating trench 17. In the illustrated embodiment, the separating trench 17 is produced so as to extend approximately with the same depth as the first trenches 12', 12" into the semiconductor body 10. This has the advantage that the later individuation of the semiconductor body regions 10a and 10b to form a plurality of semiconductor modules can be facilitated and as a result side wall insulation can be produced over the entire thickness of the semiconductor body 10 of such a semiconductor module.

Figure 3C:
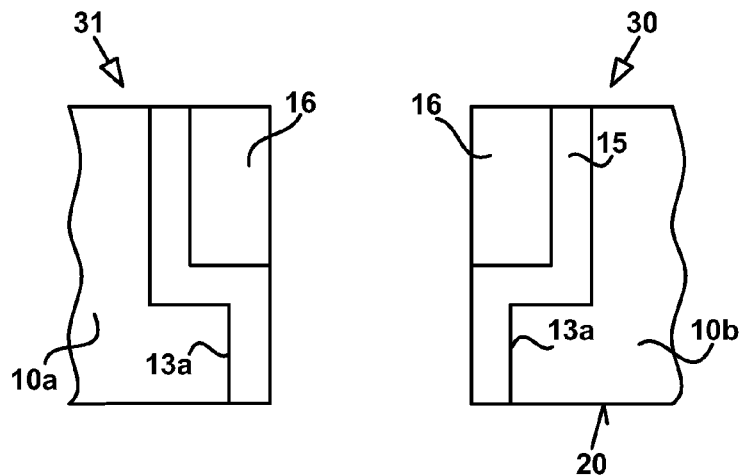

FIG. 3c illustrates the result after the individuation process of the semiconductor body 10 into semiconductor modules 30 and 31. A semiconductor module 30 or 31 respectively comprises a semiconductor body region 10a or 10b. The individuation of the semiconductor body 10 into the semiconductor body regions 10a and 10b is done, for example, by means of a thinning process of the semiconductor body 10 on the second surface 20 as far as the separating trench 17. As soon as the thinning which takes place on the second surface 20 has progressed as far as the separating trench, the initially coherent semiconductor body 10 is individuated into the semiconductor body regions 10a and 10b. The thinning process can occur only locally in the region of the separating trench 17 on the second surface 10, for example as a result of trench formation on the second surface as far as the separating trench 17. However, said thinning process can also occur over the entire second surface 20, for example by grinding, polishing, etching the semiconductor body 10, and combinations thereof.

Figure 4A:
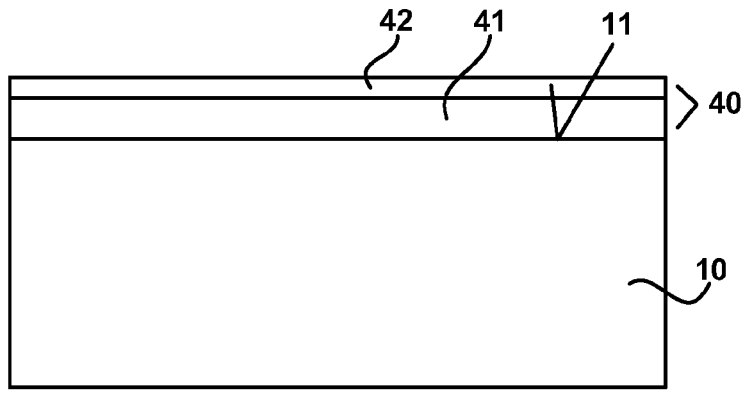
FIG. 4a to FIG. 4v show, in schematic cross-sectional views, intermediate results of a further development of the method for producing a connection region on a side wall of a semiconductor body.

FIG. 4a shows the initial situation of an exemplary embodiment of the method for producing a connection region on a side wall of the semiconductor body. A passivation layer 40 is applied to the silicon semiconductor body 10 over the entire first surface 11, which passivation layer 40 can also be composed of a plurality of component layers 41 and 42, for example a silicon oxide layer ($SiO_2$) and a nitride layer applied thereto.

Figure 4B:
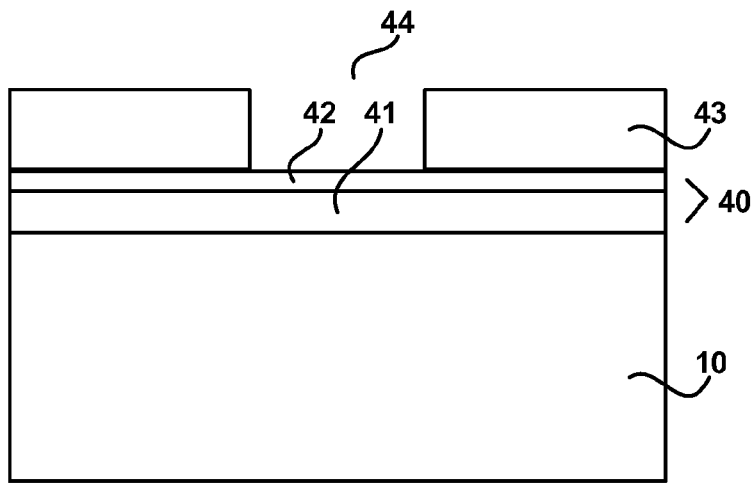

As is illustrated in FIG. 4b, a first resist mask 43 is produced on the passivation layer 40, in particular on the top component layer 42. The resist mask is produced by applying a resist over the entire surface of the passivation 40 with a subsequent lithography step. The resist mask has an opening 44, with the result that the passivation layer 40 is exposed in the opening 44.

Figure 4C:
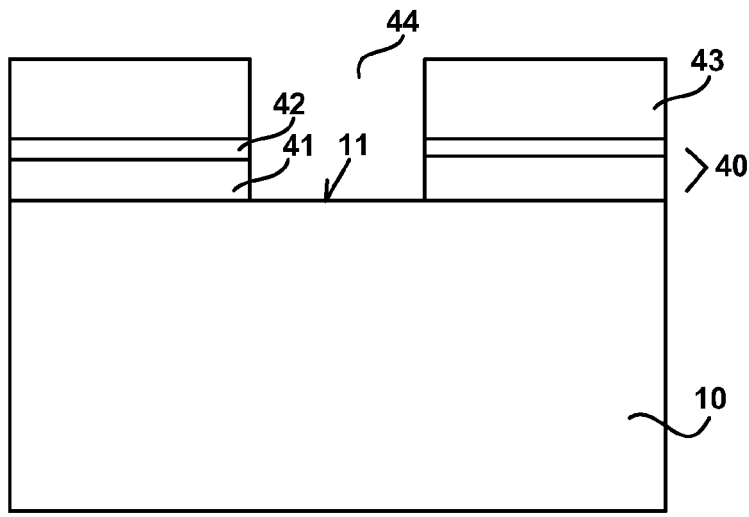

FIG. 4c shows the situation after the exposed passivation layer 40 has been removed in the opening 44, for example by means of an etching process. Part of the first surface 11 of the semiconductor body 10 is then exposed within the opening 44.

Figure 4D:
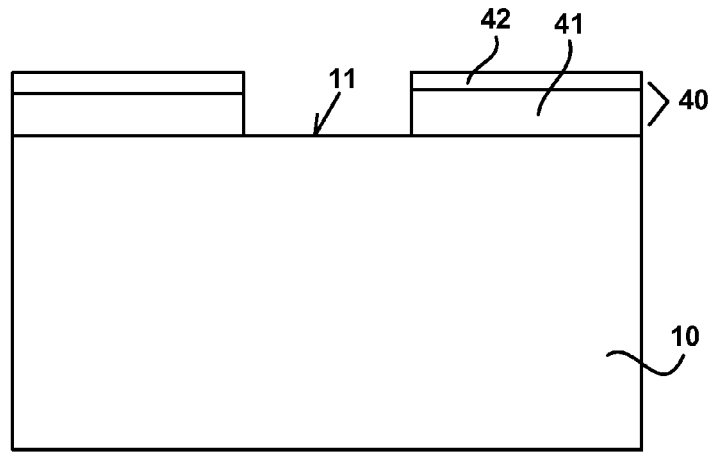
Figure 4E:
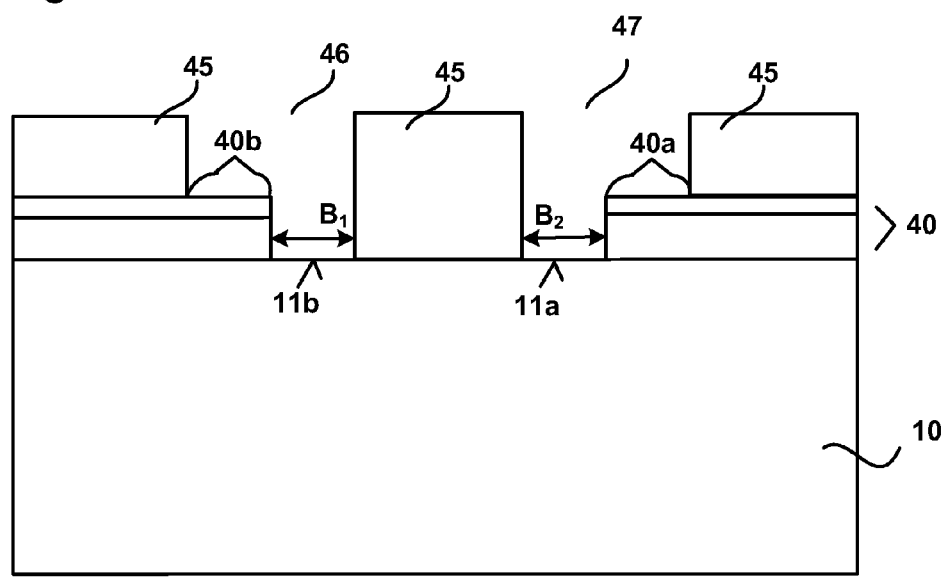

After the first resist mask 43 has been completely removed as shown in FIG. 4d, a second resist mask 45 is produced. As illustrated in FIG. 4e, the second resist mask 45 is structured in such a way that it covers part of the exposed surface 11 of the semiconductor body. In particular, the resist mask covers a centrally located part of the exposed surface 11, while the edge region 11a, 11b, adjoining the passivation layer 40, of the exposed surface 11 remains open as before. Furthermore, the resist mask 45 covers part of the passivation layer 40, wherein the edge regions 40a, 40b of the passivation layer, which are adjacent to the edge regions 11a, 11b of the surface 11, remain uncovered. As a result, openings 46, 47 are formed in the second resist mask 45 and they leave the edge regions 11a, 11b of the first surface 11 of the semiconductor body 10 and the edge regions 40a, 40b of the passivation layer 40 open.

Figure 4F:
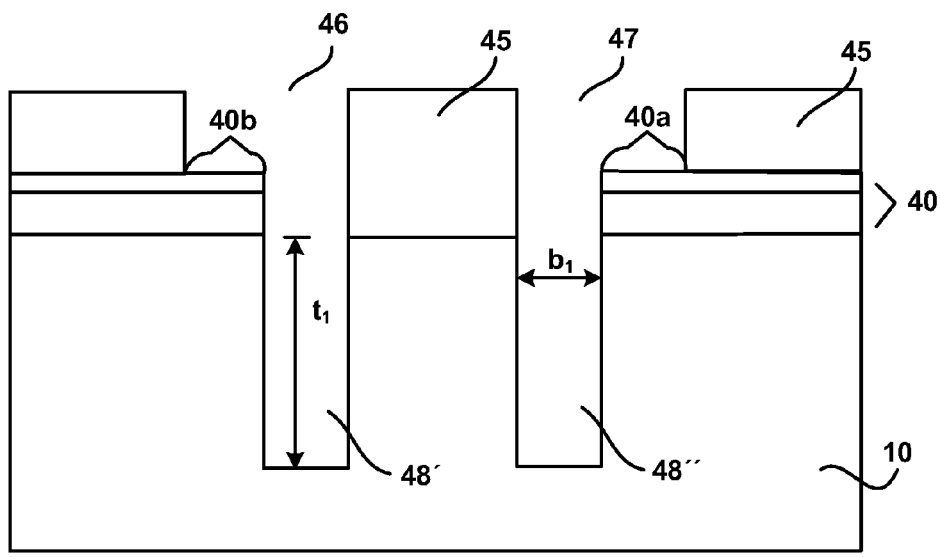

In a subsequent anisotropic etching process trenches 48', 48" are etched with a depth t1 into the semiconductor body 10, as shown in FIG. 4f. The selective etching of the semiconductor body 10 occurs in each case at the exposed edge regions 11a, 11b of the semiconductor body 10. The resist mask 45 and the passivation layer 40 serve here as an etching mask, with the result that the etched trenches 48', 48" each have approximately the width b1 of the exposed edge regions 11a, 11b.

Figure 4G:
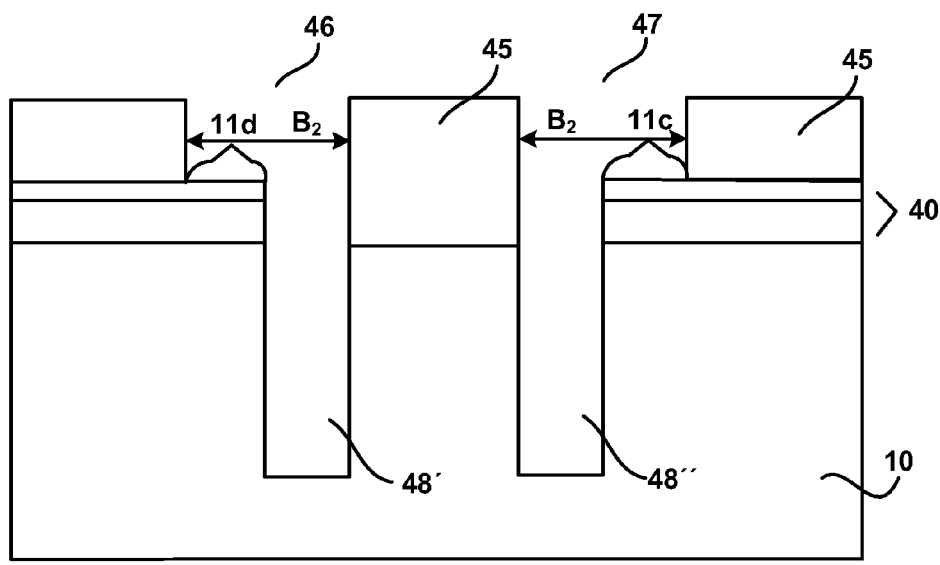

FIG. 4g shows the continuation of the method in which the edge regions 40a and 40b of the passivation layer 40 which are open on the semiconductor body 10 have been removed. As a result, the parts 11c and 11d of the surface 11 of the semiconductor body 10 which are located under these edge regions 40a and 40b and the trenches 48', 48" are now not covered by the resist mask and are exposed in the openings 46, 47.

Figure 4H:
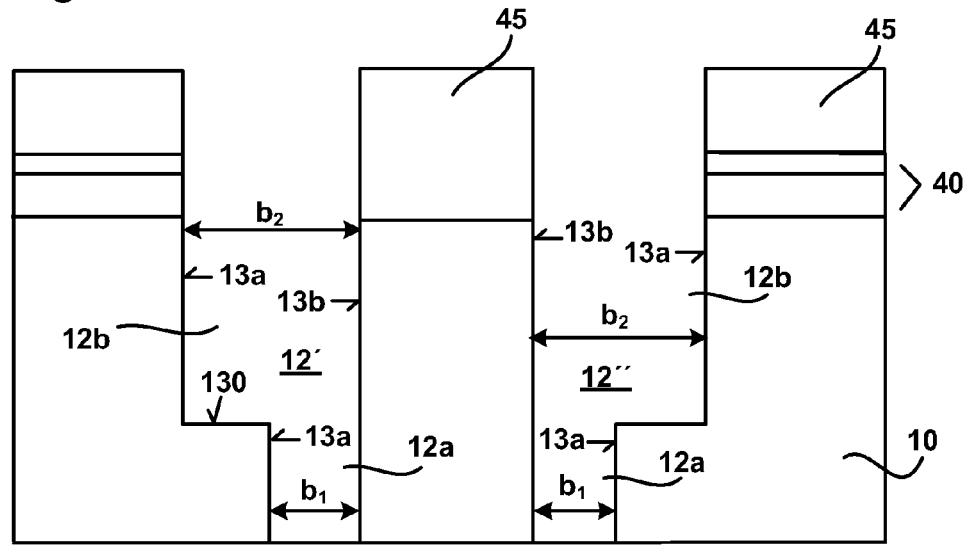

As is illustrated in FIG. 4h, the trenches 48', 48" are etched further into the semiconductor body 10 with a subsequent anisotropic etching process. Furthermore, the anisotropic etching of the semiconductor body 10 now also occurs next to the trenches 48', 48" on the open parts 11c and 11d of the surface 11 of the semiconductor body 10 into the semiconductor body 10. The anisotropic etching of the semiconductor body 10 in the perpendicular direction to the surface 11 into the semiconductor body 10 occurs virtually at the same speed in the trenches 48', 48" and at the regions 11c and 11d located next to them. As a result, as already illustrated in FIG. 3a, two-part first trenches 12', 12" are produced. The first trench part 12a with a width b1 is made narrower here than the second trench part 12b with a width b2. The first trench part 12a is also produced so as to extend in each case deeper into the semiconductor body 10 than the second trench part 12b. The side wall 13b of the two illustrated first trenches 12', 12", which are located opposite one another and are separated from one another by a part of the semiconductor body 10, are formed without a step. In contrast, the side wall 13a, respectively located opposite the side wall 13b, of the first trenches 12', 12" has a step 130.

Figure 4I:
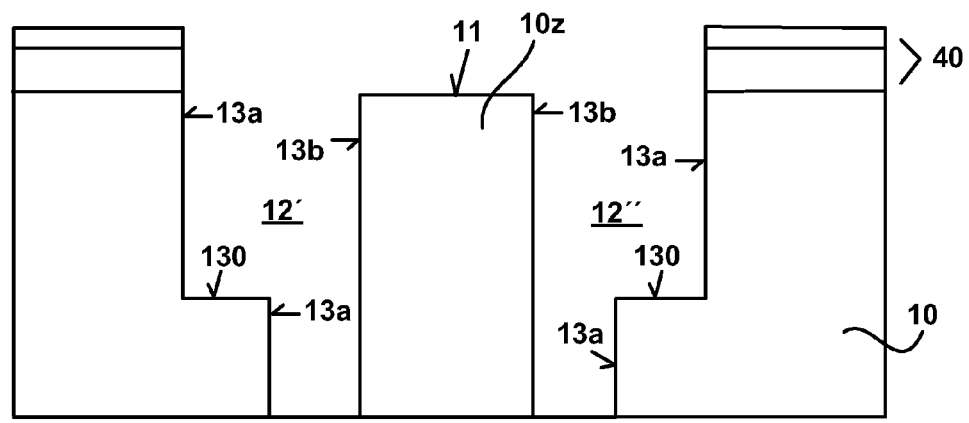

FIG. 4i shows the semiconductor body 10 with the first trenches 12', 12" which are formed therein and are divided into two. On the surface 11 of the semiconductor body 10 there is still the remaining part of the passivation layer 40, while the resist mask 45 has been completely removed. The surface 11 of the part 10z of the semiconductor body 10 which is located between the two first trenches 12', 12" is therefore not covered.

Figure 4J:
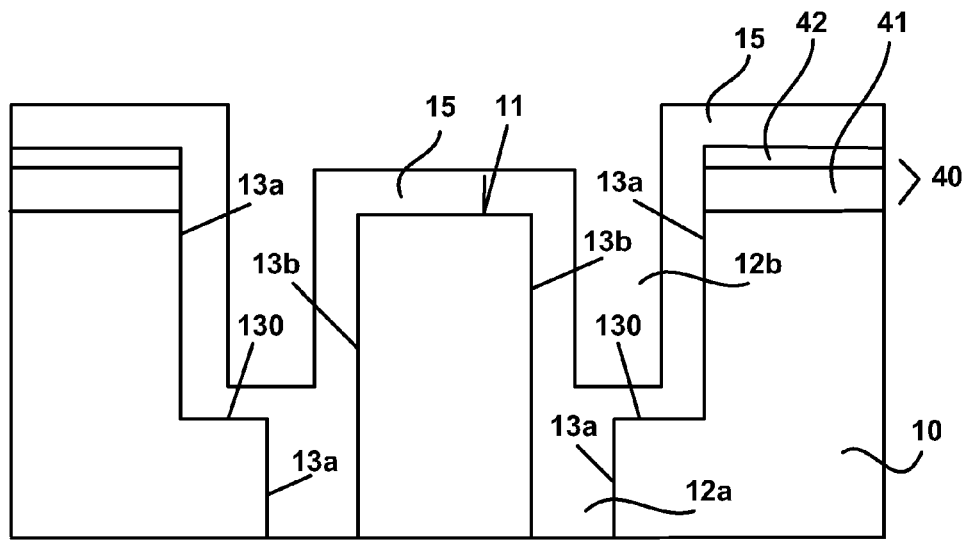

As shown in FIG. 4j, an electrical insulation layer 15 is applied over the entire surface of the semiconductor body 10. The electrical insulation layer 15, in particular an $SiO_2$ layer, is deposited on the semiconductor body 10 e.g. by means of SA-BPSG (Sub-Atmospheric Boron Phosphorus Silicate Glass) and/or produced by thermal oxidation of the semiconductor body 10. The electrical insulation layer 15 extends over all the open surfaces of the semiconductor body 10. As illustrated, the electrical insulation layer 15 therefore covers, in particular, the surface 11 of the semiconductor body 10 and the side walls 13a and 13b as well as the step 130 of the first trenches 12', 12". The electrical insulation layer 15 is produced here with such a thickness that the first trench part 12a of each of the two-part first trenches 12', 12" is completely filled by the electrical insulation layer 15, while an open part of the first trenches 12', 12" remains in the second trench part 12b of the first trenches 12', 12". In one variant (not illustrated), shrinkage cavitation could also remain within the first trench part 12a. In this variant, at least the junction between the first trench part 12a and the second trench part 12b is closed by the electrical insulation layer 15. Furthermore, FIG. 4j shows that the electrical insulation layer 15 is also formed on the passivation layer 40, in particular on the top component layer 42 of the assembled passivation layer 40.

Figure 4K:
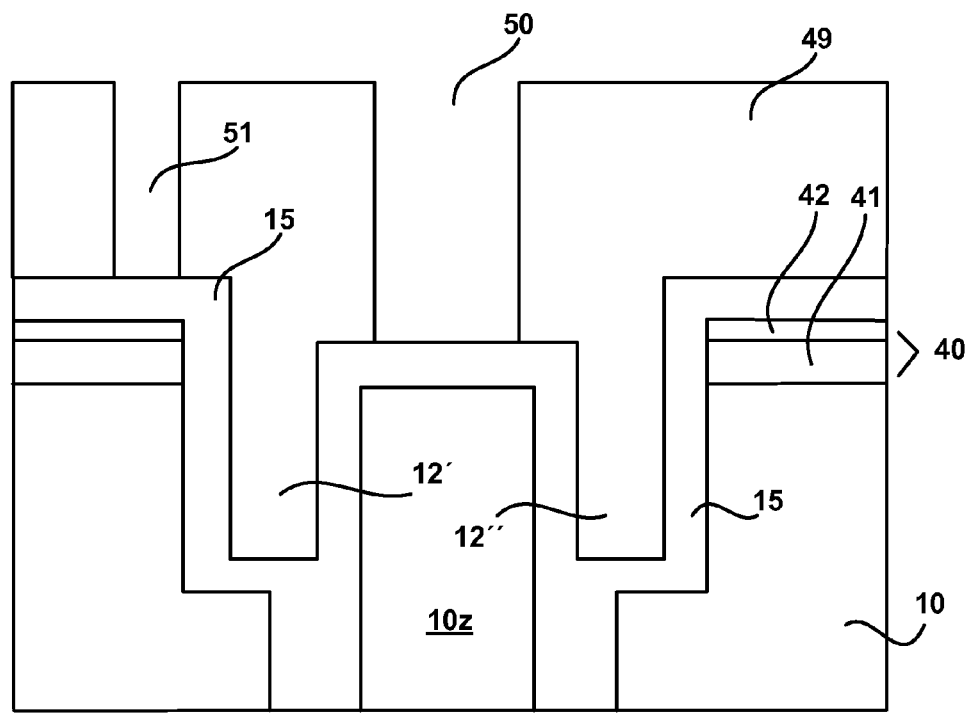

FIG. 4k shows the continuation of the method, wherein a further resist mask 49 is produced on the electrical insulation layer 15. The further resist mask 49 is structured in a lithography step in such a way that openings are formed in the further resist mask 49. An opening 50 of the resist mask 49 is arranged over the part 10z of the semiconductor body 10 which is located between the first trenches 12 and in which the separating trench is formed in a later method step. The opening 50 is formed here with such a width that the electrical insulation layer 15 is completely exposed over the part 10z of the semiconductor body 10. A further opening 51 in the resist mask 49 is arranged over the region of the semiconductor body 10 which is still covered with the passivation layer 40. The further opening 51 exposes here a part of the electrical insulation layer 15 on the passivation layer 40, in particular on the top component layer 42 of the assembled passivation layer 40.

Figure 4L:
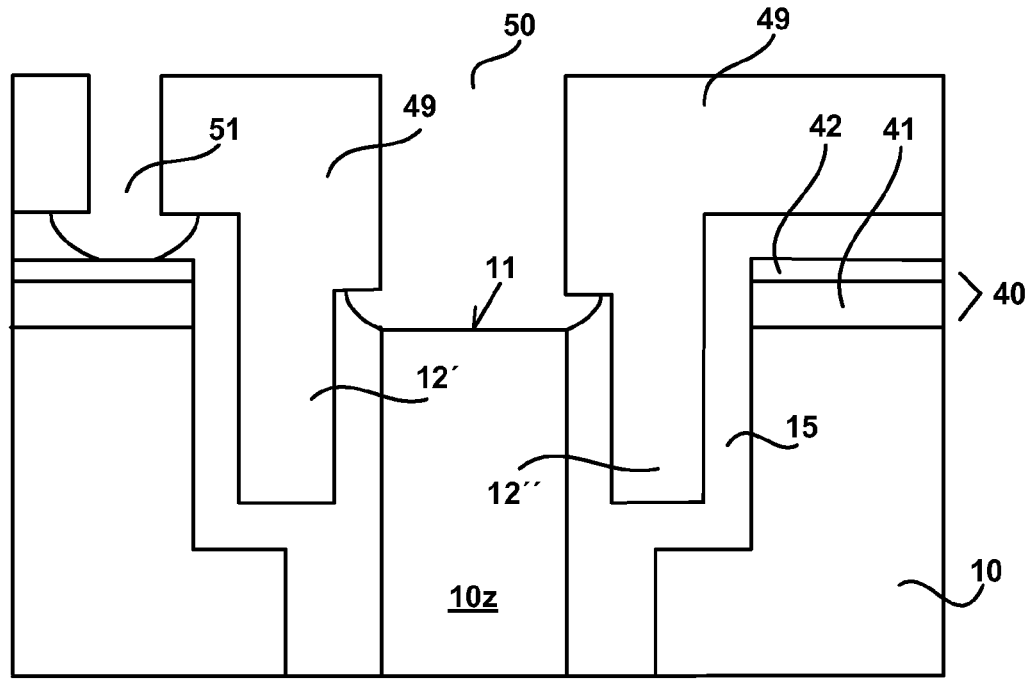

As is illustrated in FIG. 4*l*, wet chemical etching of the electrical insulation layer 15 is carried out through the openings 50 and 51. This selectively executed wet chemical etching of the electrical insulation layer 15 exposes the surface 11 of the semiconductor body 10 under the opening 50. The passivation layer 40, in particular the top component layer 42 of the assembled passivation layer 40, is exposed under the opening 51.

Figure 4M:
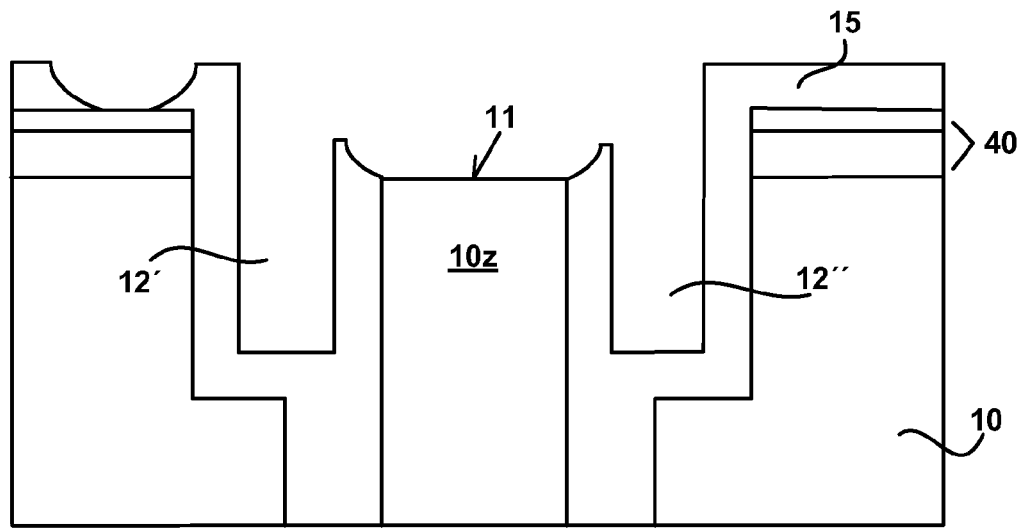
Figure 4N:
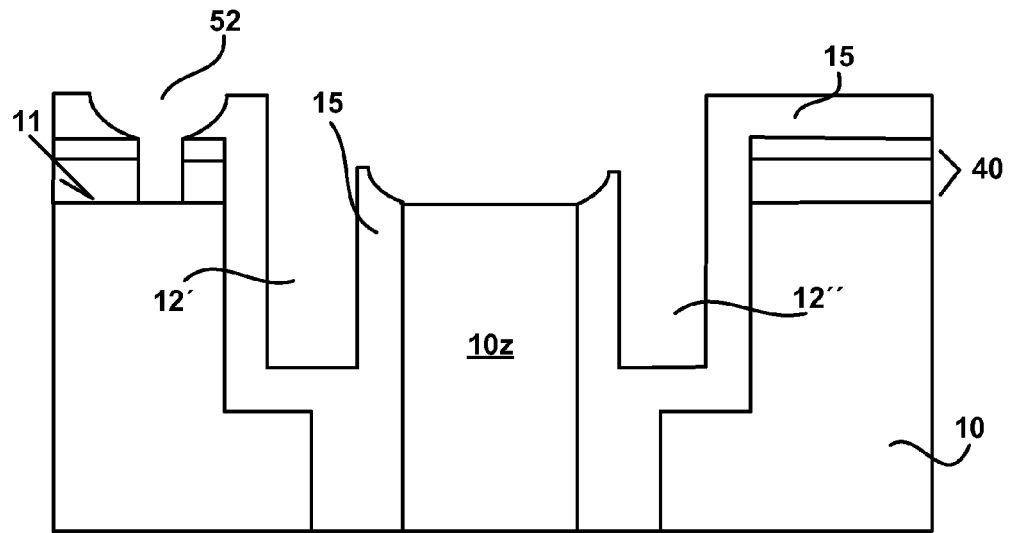

After the further resist mask 49 has been removed again, as shown in FIG. 4*m*, the passivation layer 40 is etched using an RIE (Reactive Ion Etching) method without additional resist masking. The RIE etching is carried out selectively on the passivation layer 40. Owing to the presence of the electrical insulation layer 15, the etching occurs only at the exposed locations of the passivation layer 40. This results, as illustrated in FIG. 4*n*, in a contact hole 52 in the passivation layer 40, said contact hole 52 being bounded by the rest of the passivation layer 40 and extending as far as the surface 11 of the semiconductor body 10.

Figure 4O:
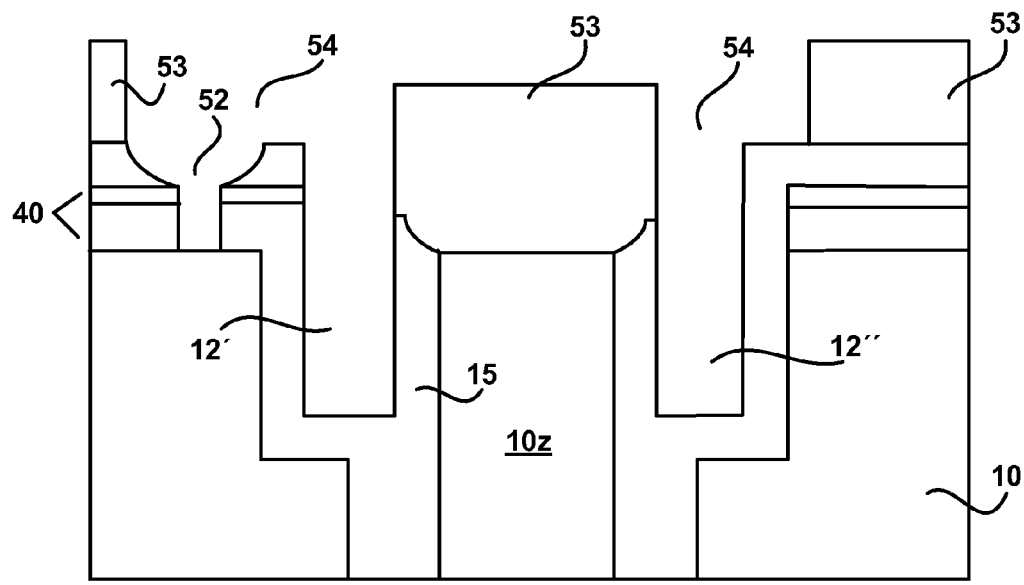

As is shown in FIG. 4*o*, a mask 53 is subsequently produced on the semiconductor body 10 and serves as a boundary for an electrically conductive layer to be produced later in a structured fashion. The mask 53 has an opening 54 over a first trench 12 in each case. Furthermore, at least one of these openings 54 extends from a first trench 12 as far as a contact hole 52 which is located closest to this first trench 12.

Figure 4P:
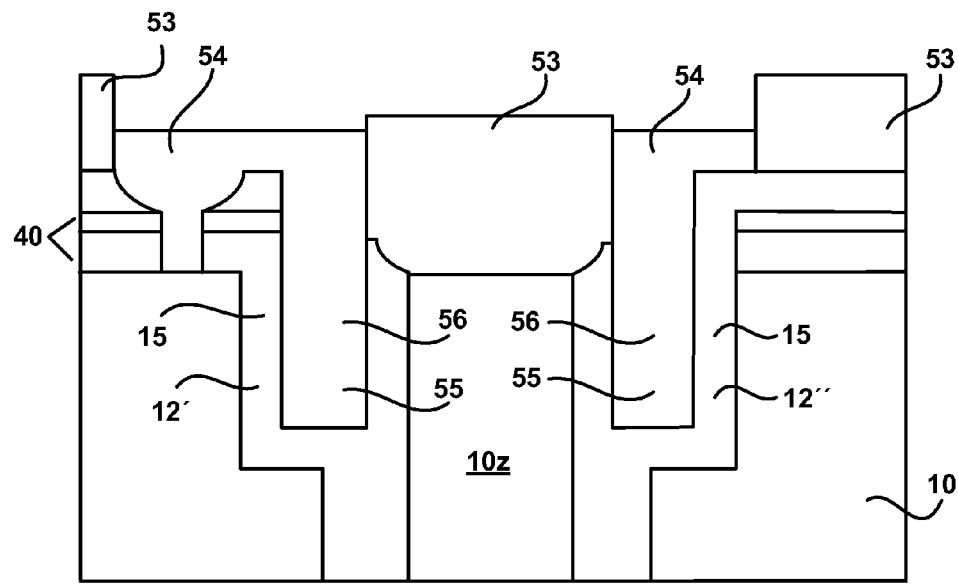

As illustrated in FIG. 4*p*, the still open part of each first trench 12 and at least the bottom of each opening 54 is filled with an electrically conductive material 55. The conductive material 55 may be a metal such as, for example, copper, with which an electrically conductive layer 56 is produced on the semiconductor body 10 using, for example, a galvanic process. An electrically conductive seed layer, which is then part of the electrically conductive layer 56, is required for a galvanic process. An electrically conductive layer 56, which extends from the first trench 12 as far as the contact hole 52, is therefore formed in the respective opening 54 which extends from the first trench 12 as far as the contact hole 52 which is located closest thereto. This electrically conductive layer 56 is in direct electrical contact with the semiconductor body 10 in the contact hole 52. Otherwise, the electrically conductive layer 56 is separated from the semiconductor body 10 at least by the electrical insulation layer 15.

Figure 4Q:
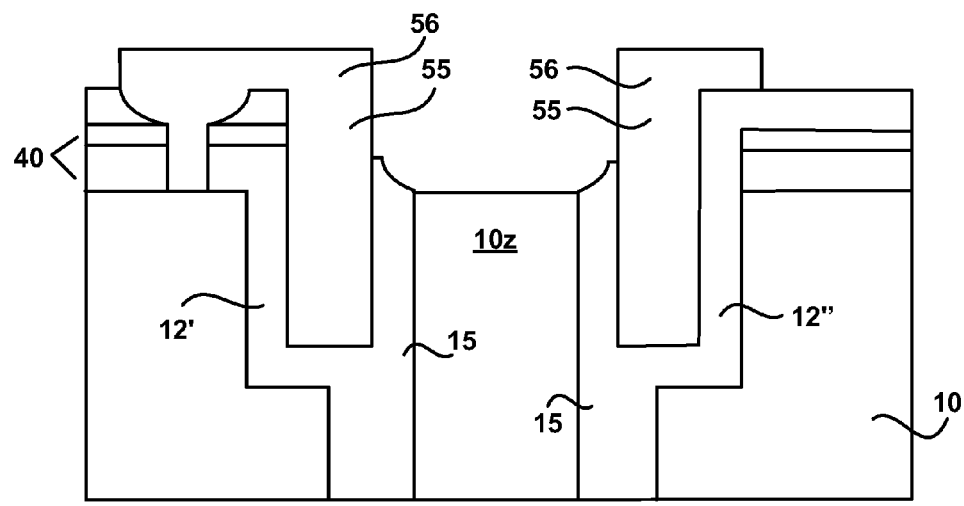

FIG. 4*q* shows the structured, electrically conductive layer 56 on the semiconductor body 10 after the mask 53 has been removed. The surface 11 of the part 10*z* of the semiconductor body 10 between the two first trenches 12', 12" is therefore exposed again.

Figure 4R:
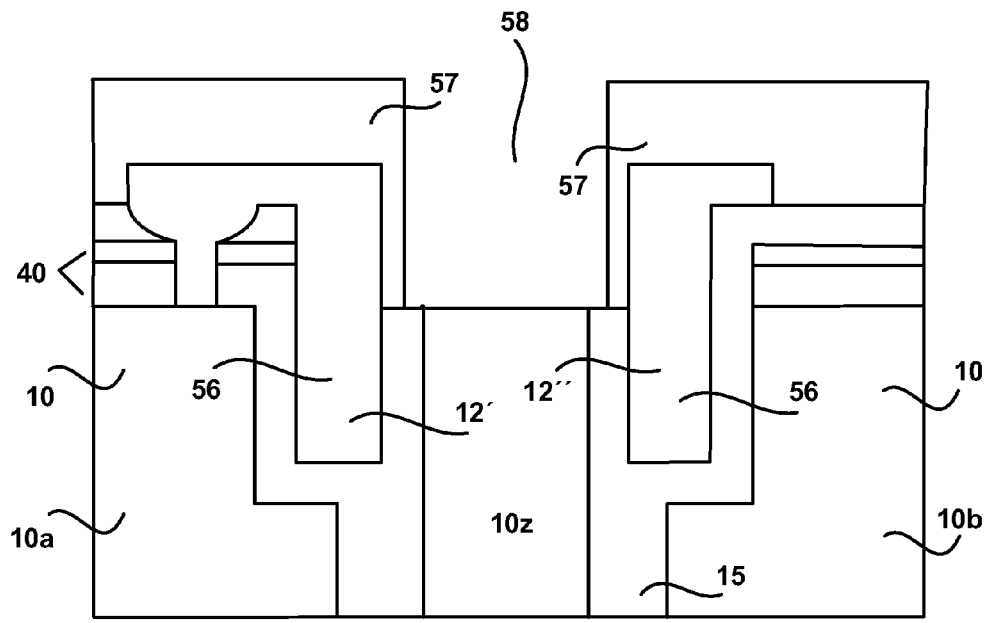

As illustrated in FIG. 4*r*, a further etching mask 57, which has an opening 58 over the part 10*z* of the semiconductor body 10, is applied over the semiconductor body 10. The opening 58 in the etching mask 57 permits access to the part 10*z* of the semiconductor body 10 which is located between the two adjacent first trenches 12', 12" and between two semiconductor body regions 10*a* and 10*b*.

Figure 4S:
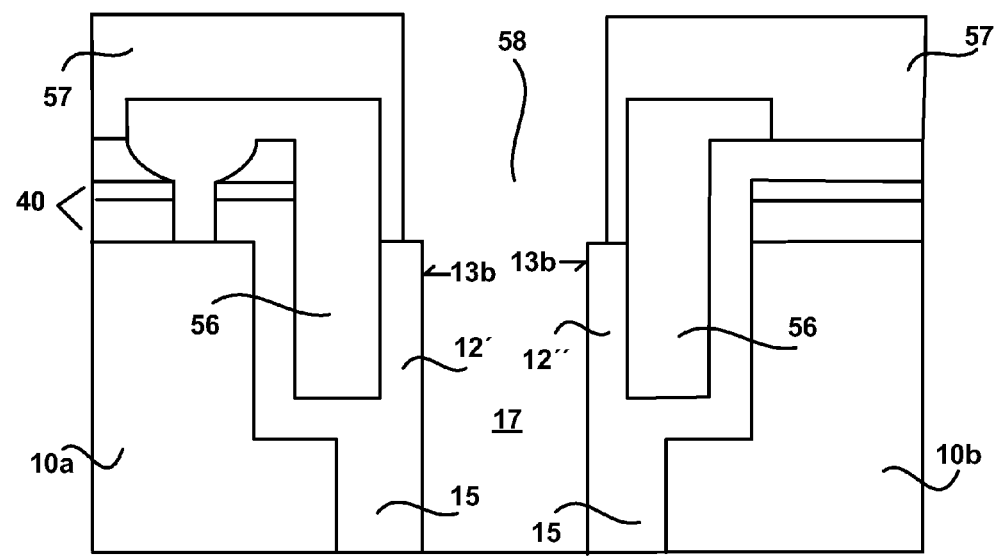

As is shown in FIG. 4*s*, the part 10*z* of the semiconductor body 10 between the two adjacent trenches 12', 12" and between the two semiconductor body regions 10*a*, and 10*b* is etched out of the semiconductor body 10 under the opening 58 by means of a selective etching process. As a result a separating trench 17 is produced between the two semiconductor body regions 10*a* and 10*b* along the two adjacent first trenches 12', 12". The separating trench 17 exposes the electrical insulation layer 15 on the side walls 13*b* of the first trenches 12.

Figure 4T:
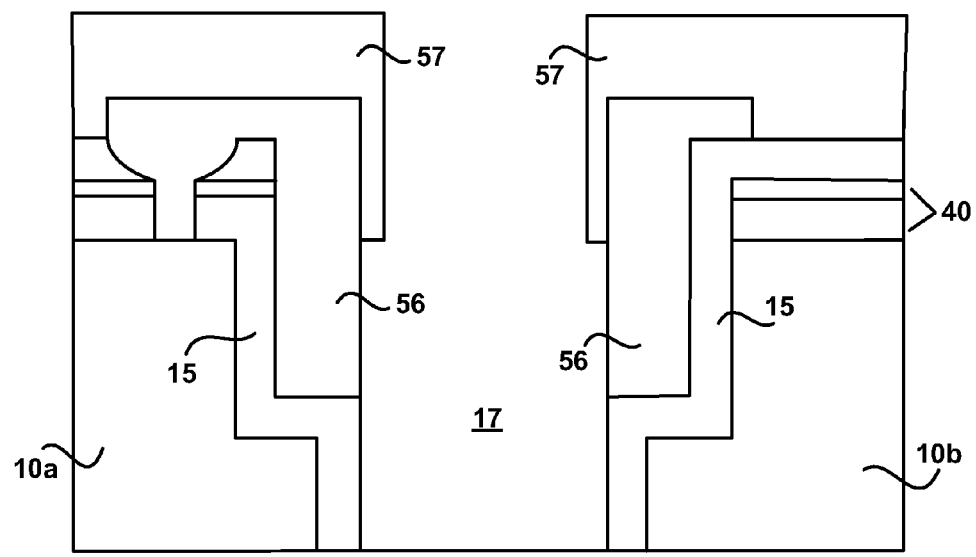

FIG. 4*t* shows the method step in which the electrical insulation layer 15 on the side walls 13*b* of the first trenches 12', 12" is removed. The removal of the electrical insulation layer 15 is carried out, for example, by wet chemical etching of the electrical insulation material 15 in the separating trench 17. The wet chemical etching can be carried out along the side walls 13*b* in a uniform fashion until the electrically conductive layer 56 is reached. The etching ends at this electrically conductive layer 56. The electrically conductive layer 56 is therefore exposed in the separating trench 17.

Figure 4U:
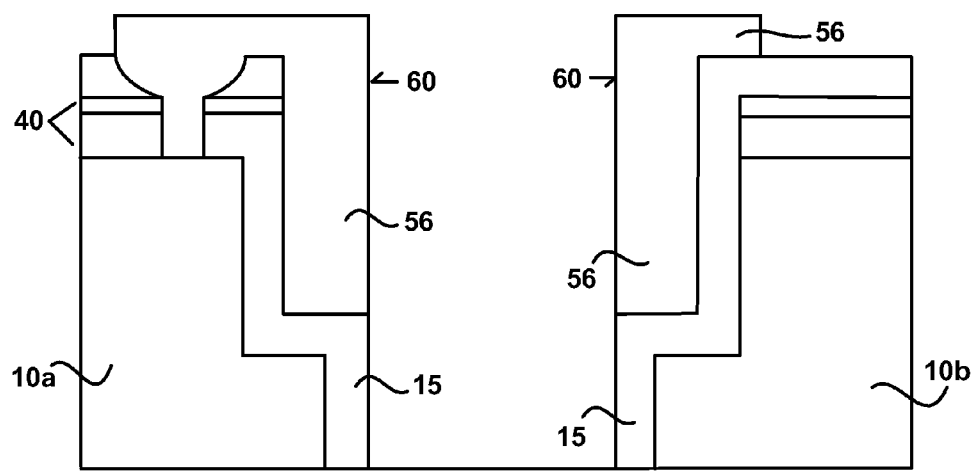

As is shown in FIG. 4*u*, the etching mask 57 is subsequently removed. The electrically conductive layer 56 forms in each case a connection region on a side wall 60 of the respective semiconductor body region 10*a* and 10*b*.

Figure 4V:
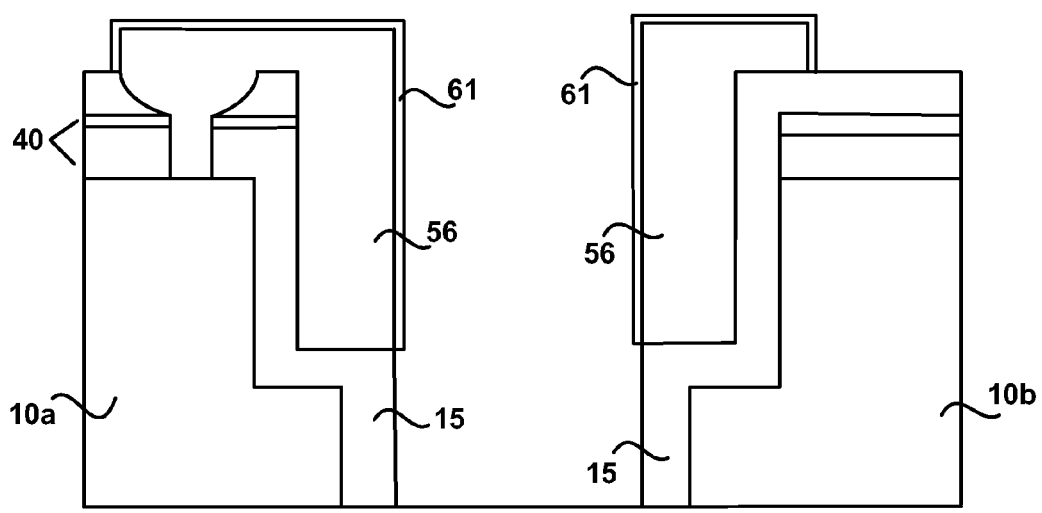

FIG. 4*v* shows a variant in which the exposed, electrically conductive layer 56 is still covered with an electrically conductive protective layer 61. This electrically conductive protective layer 61 is produced, for example, as a single layer or as multiple layers. The protective layer 61 has, for example, nickel phosphorus NiP and/or gold palladium AuPd.

FIG. 5 shows an exemplary embodiment in which an electrically conductive layer 56 extends from the side wall 60 of the semiconductor body region 10*a* as far as the contact region 62 of the semiconductor body region 10*a*. The exemplary embodiment provides that the passivation layer 40 and/or the electrical insulation layer 15 are/is arranged only as far as the contact region 62 on the first surface 11 of the semiconductor body 10. The electrically conductive layer 56 is therefore insulated from the semiconductor body 10 only as far as the contact region 62. In the contact region 62, the electrically conductive layer 56 is made to run over the edge 63 of the electrically insulating layer 15 and/or of the passivation layer 40 onto the surface 11 of the semiconductor body region 10*a*. In the exemplary embodiment, the first trenches 12', 12" which are divided into two extend as far as a depth T1. The separating trench 17 extends to a very much larger depth T2 into the semiconductor body 10 between the first trenches 12', 12". As a result, pre-separation of the semiconductor body regions 10*a* and 10*b* is brought about. In a later thinning process on the rear side, opposite the first surface 11, of the semiconductor body 10, the two semiconductor body regions 10*a* and 10*b* are separated completely.

In one exemplary embodiment as illustrated in FIG. 6, the electrical connection between the semiconductor body 10 and the electrically conductive layer 56 is produced by means of an additional electrically conductive contact element. This may be advantageous if, for example, aluminum is used as the electrically conductive material 55 for the electrically conductive layer 56. The electrically conductive contact element 64 is formed between the electrically conductive layer 56 and the semiconductor body 10, for example in the passivation layer 40. In particular the electrically conductive contact element 64 can be formed in a passivation layer 40 in just one component layer, said passivation layer 40 being composed of a plurality of component layers 41 and 42. As shown in FIG. 6, the electrically conductive contact element 64 may be formed, for example, only in the component layer 41 adjoining the surface 11 of the semiconductor body 10. In the component layer 42, located above the latter, of the passivation layer 40 a contact hole 52 then has to be produced extending as far as the contact element 64.

Figure 7:
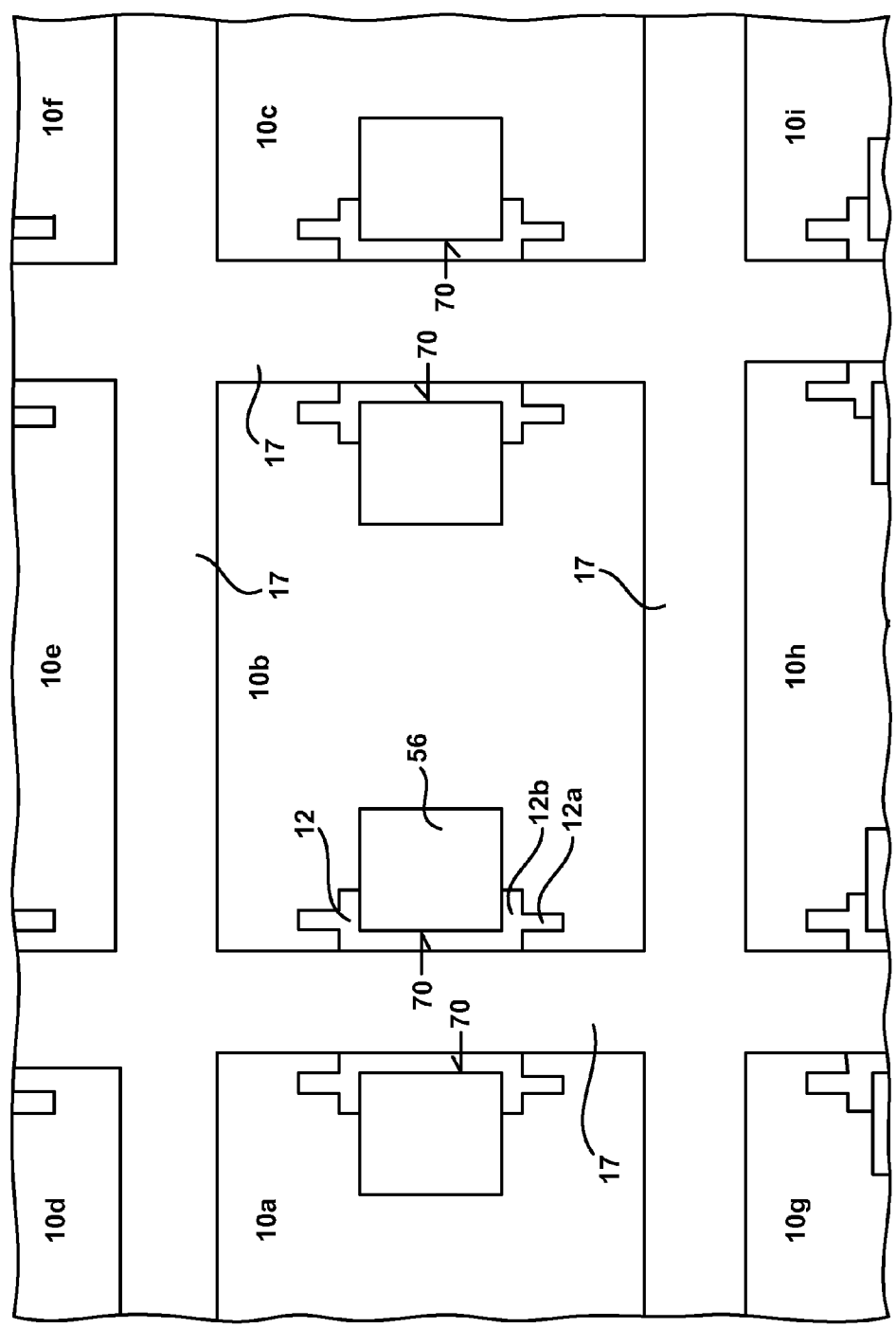
FIG. 7 shows, in a schematic plan view, an exemplary embodiment of the method for producing a connection region on a side wall of a semiconductor body.

FIG. 7 shows a plan view of an exemplary embodiment of a semiconductor body 10 which is divided into a plurality of component regions 10*a* to 10*i*. The individual semiconductor body regions 10*a* to 10*i* are of rectangular design in this example and are each separated from one another by a separating trench 17. Each semiconductor body region 10*a* to 10*i* has in each case two connection regions, formed by the electrically conductive layer 56, on two opposite side walls 70 of the respective semiconductor body region. Each semiconductor body region 10*a* to 10*i* forms, after the complete separation of the semiconductor body regions 10*a* to 10*i*, a respective functionally capable semiconductor module having two connection regions on the side walls 70. The complete separation of the semiconductor body regions 10*a* to 10*i* into the individual semiconductor modules does not occur until the end of the other method steps which are to be performed on the individual semiconductor body regions 10*a* to 10*i*.

Figure 8:
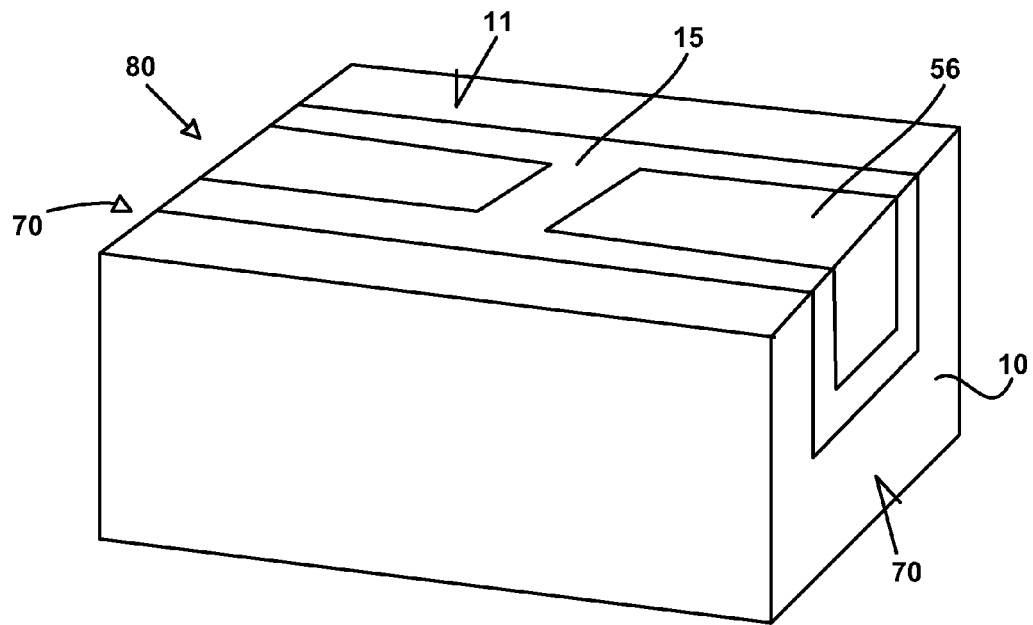
FIG. 8 shows, in a spatial illustration, an exemplary embodiment of a semiconductor module.

FIG. 8 is a spatial illustration of a semiconductor module 80 which has been produced according to the described method. The semiconductor module has a right-parallelepiped basic shape. The semiconductor body 10 is provided on the side walls 70 and on the first surface 11 with an electrical insulation layer 15. Two electrically conductive layers 56, which are at a distance from one another, are formed on the side walls 70 on the electrical insulation material 15 and extend over the first surface 11 as far as the electrical contact regions in which the electrically conductive layers 56 produce an electrically conductive connection with the semiconductor body 10 through the electrical insulation layer 15 and/or the passivation layer 40.

Figure 9:
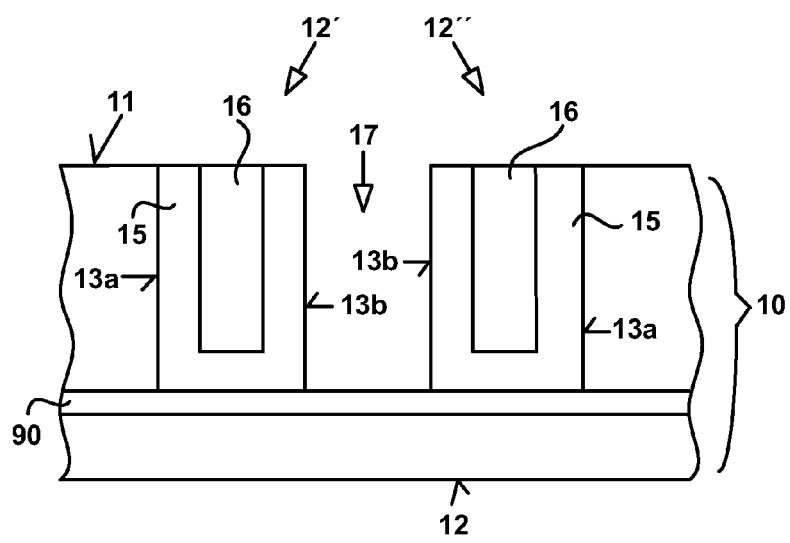
FIG. 9 shows, in a schematic cross-sectional view, an intermediate result of a further exemplary embodiment of the method for producing a connection region on a side wall of a semiconductor body.

FIG. 9 illustrates a further exemplary embodiment in which the method is carried out on a semiconductor body 10 with an additional insulation layer 90 in the semiconductor body 10. Such a semiconductor body may be, for example, an SOI material. In this exemplary embodiment, the first trenches 12', 12" are produced as far as the additional insulation layer 90. During the subsequent individuation of the semiconductor body 10 into semiconductor modules, the semiconductor body 10 is thinned on the second surface 20 of the semiconductor body 10 as far as the additional insulation layer 90. The rear of the finished semiconductor module then has a rear insulation. As a result, semiconductor modules can be produced with an insulation layer on all sides, said semiconductor modules having an open electrical terminal of the semiconductor body on the side walls.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for making a semiconductor device, the method comprising:
forming a first trench at a first surface of a semiconductor body, the first trench extending into the semiconductor body, wherein the first trench is formed in two parts, wherein a first trench part is narrower than a second trench part, wherein the first trench part comprises a first central axis in a direction perpendicular to the semiconductor body, wherein the second trench part comprises a second central axis in a direction perpendicular to the semiconductor body, and wherein the first central axis is laterally spaced from the second central axis;
forming an insulation layer on side walls and on a bottom surface of the first trench such that the first trench is only partially filled;
filling an unfilled part of the first trench with an electrically conductive material;
forming a separating trench adjacent the first trench in such a way that a side wall of the separating trench directly adjoins the first trench part; and
removing at least a portion of the insulation layer that adjoins the separating trench such that at least some of the electrically conductive material in the first trench is exposed, wherein the first trench part extends deeper into the semiconductor body than the second trench part, and wherein the separating trench extends deeper into the semiconductor body than the first trench.

2. The method as claimed in claim 1, wherein forming the first trench comprises:
generating a mask layer over the first surface of the semiconductor body;
forming a first mask opening with a first width in the mask layer;
etching the semiconductor body under the first mask opening;
widening the first mask opening to form a second mask opening with a second width; and
etching the semiconductor body under the second mask opening so that the first and second trench parts are formed.

3. The method as claimed in claim 1, wherein forming the insulation layer comprises completely filling the first trench part with the insulation layer.

4. The method as claimed in claim 1, wherein a side wall of the first trench part oriented toward the separating trench and a side wall of the second trench part oriented toward the separating trench form a planar side wall of the first trench.

5. The method as claimed in claim 1, wherein forming the first trench comprises forming two first trenches, wherein the separating trench is formed between the two first trenches.

6. The method as claimed in claim 5, wherein the two first trenches adjoin each of two opposite side walls of the separating trench.

7. The method as claimed in claim 1, wherein the insulation layer is formed on a side wall of the first trench facing away from the separating trench and on the bottom surface of the first trench with a thickness of at least 2 μm.

8. The method as claimed in claim 1, further comprising coating the exposed electrically conductive material with an electrically conductive protective layer.

9. The method as claimed in claim 8, wherein the electrically conductive protective layer wettable by a solder.

10. The method as claimed in claim 1, wherein the exposed electrically conductive material is wettable by a solder.

11. The method as claimed in claim 1, wherein the semiconductor body is provided with a further insulation layer in the semiconductor body, wherein the further insulation layer is formed in the semiconductor body at a distance from the first surface and parallel to the first surface of the semiconductor body.

12. The method as claimed in claim 11, wherein the first trench extends as far as the further insulation layer in the semiconductor body.

13. The method as claimed in claim 1, wherein the method is used in production of a semiconductor module having a connection region on a side wall of the semiconductor module and wherein the separating trench extends from the first surface of the semiconductor body as far as an opposite surface of the semiconductor body.

14. A method for making a semiconductor device, the method comprising:
forming a first trench at a first surface of a semiconductor body, the first trench extending into the semiconductor body, wherein the first trench is formed in two parts, wherein a first trench part is narrower than a second trench part, wherein the first trench part comprises a first central axis in a direction perpendicular to the semiconductor body, wherein the second trench part comprises a second central axis in a direction perpendicular to the semiconductor body, and wherein the first central axis is laterally spaced from the second central axis, and wherein the first trench part extends deeper into the semiconductor body than the second trench part;

forming an insulation layer on side walls and on a bottom surface of the first trench such that the first trench is only partially filled;

filling an unfilled part of the first trench with an electrically conductive material;

forming a separating trench adjacent the first trench in such a way that a side wall of the separating trench directly adjoins the first trench part; and removing at least a portion of the insulation layer that adjoins the separating trench such that at least some of the electrically conductive material in the first trench is exposed, wherein the electrically conductive material forms an electrically conductive layer that extends from the first trench to a contact region for the semiconductor body, wherein the contact region is located on the first surface of the semiconductor body at a lateral distance from the first trench.

15. The method as claimed in claim 14, further comprising forming an electrically conductive contact element between the electrically conductive layer and the semiconductor body in the contact region so that an electrical connection is produced between the semiconductor body and the electrically conductive layer.

16. A method for making a semiconductor device, the method comprising:

forming a first trench at a first surface of a semiconductor body, the first trench extending into the semiconductor body, wherein the first trench is formed in two parts, wherein a first trench part is narrower than a second trench part, wherein a central axis of the first trench part is laterally spaced away from a central axis of the second trench part, and wherein the first trench part extends deeper into the semiconductor body than the second trench part;

forming an insulation layer on side walls and on a bottom surface of the first trench such that the first trench is only partially filled;

filling an unfilled part of the first trench with an electrically conductive material;

forming a separating trench adjacent the first trench in such a way that a side wall of the separating trench directly adjoins the first trench part; and removing at least a portion of the insulation layer that adjoins the separating trench such that at least some of the electrically conductive material in the first trench is exposed, wherein the method is used in production of a semiconductor module having a connection region on a side wall of the semiconductor module, wherein the separating trench is produced extending from the first surface of the semiconductor body into the semiconductor body, and at least part of the semiconductor body on a second surface, which is located opposite the first surface, is removed as far as the separating trench.

17. The method as claimed in claim 16, further comprising forming a further trench on the second surface of the semiconductor body, the further trench extending as far as the separating trench.

18. The method as claimed in claim 17, further comprising thinning the semiconductor body over the entire second surface until the second surface of the semiconductor body reaches the separating trench.

\* \* \* \* \*